United States Patent
Hwang et al.

(10) Patent No.: US 10,902,774 B2
(45) Date of Patent: Jan. 26, 2021

(54) PIXEL PREVENTING LEAKAGE CURRENT AND DISPLAY DEVICE USING THE SAME

(71) Applicant: Samsung Display Co., Ltd., Yongin-Si (KR)

(72) Inventors: Young-In Hwang, Suwon-si (KR); Sung Ho Kim, Suwon-si (KR); Eung Taek Kim, Hwaseong-si (KR); Yong Ho Yang, Suwon-si (KR); Seong Min Wang, Seongnam-si (KR); Jung-Mi Choi, Seoul (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/285,080

(22) Filed: Feb. 25, 2019

(65) Prior Publication Data

US 2019/0279567 A1    Sep. 12, 2019

(30) Foreign Application Priority Data

Mar. 7, 2018    (KR) .................. 10-2018-0027043

(51) Int. Cl.
*G09G 3/3233*    (2016.01)
*G09G 3/3291*    (2016.01)
(Continued)

(52) U.S. Cl.
CPC ......... *G09G 3/3233* (2013.01); *G09G 3/3258* (2013.01); *G09G 3/3266* (2013.01);
(Continued)

(58) Field of Classification Search
CPC .. G09G 3/3233; G09G 3/3258; G09G 3/3266; G09G 3/3291; G09G 2300/0426; G09G 2300/0809; G09G 2320/0214; G09G 2310/061; G09G 2320/043; G09G 2310/0262; G09G 2310/0251;
(Continued)

(56) References Cited

U.S. PATENT DOCUMENTS

2013/0201172 A1*  8/2013  Jeong ............... G09G 3/3233
                                                        345/212
2014/0117340 A1*  5/2014  Kim ................ H01L 27/1255
                                                        257/40
(Continued)

FOREIGN PATENT DOCUMENTS

KR       10-0570696 B1       4/2006
KR    10-2011-0127006 A     11/2011
(Continued)

*Primary Examiner* — Premal R Patel
(74) *Attorney, Agent, or Firm* — Innovation Counsel LLP

(57) ABSTRACT

A pixel includes: an organic light emitting diode; a first transistor including a gate that is connected to a first node, wherein the first transistor is connected between a second node and a third node; a second transistor including a gate that is connected to a corresponding scan line, wherein the second transistor is connected between a data line and the second node; a storage capacitor connected between the first node and a first voltage; a third transistor including a gate that is connected to the corresponding scan line, the third transistor is connected between the first node and the third node; and a fourth transistor connected between a first end of the first transistor and a second voltage.

19 Claims, 8 Drawing Sheets

(51) Int. Cl.
*G09G 3/3266* (2016.01)
*H01L 27/32* (2006.01)
*G09G 3/3258* (2016.01)

(52) U.S. Cl.
CPC ....... *G09G 3/3291* (2013.01); *H01L 27/3276* (2013.01); *G09G 2300/0426* (2013.01); *G09G 2300/0809* (2013.01); *G09G 2320/0214* (2013.01)

(58) Field of Classification Search
CPC .... G09G 2300/0861; G09G 2300/0842; H01L 27/3276
See application file for complete search history.

(56) References Cited

U.S. PATENT DOCUMENTS

| | | | | |
|---|---|---|---|---|
| 2015/0049126 A1* | 2/2015 | Jung | ............... | G09G 3/3233 345/690 |
| 2015/0170576 A1* | 6/2015 | Bae | ............... | G09G 3/3225 345/205 |
| 2015/0255523 A1* | 9/2015 | Her | ............... | H01L 27/3262 345/76 |
| 2016/0321994 A1* | 11/2016 | Lee | ............... | G09G 3/3258 |

FOREIGN PATENT DOCUMENTS

| | | |
|---|---|---|
| KR | 10-2012-0074847 A | 7/2012 |
| KR | 10-2013-0091136 A | 8/2013 |
| KR | 10-2017-0060214 A | 6/2017 |

\* cited by examiner

PIXEL PREVENTING LEAKAGE CURRENT AND DISPLAY DEVICE USING THE SAME

CROSS-REFERENCE TO RELATED APPLICATION

This application claims priority to and the benefit of Korean Patent Application No. 10-2018-0027043 filed in the Korean Intellectual Property Office on Mar. 7, 2018, the disclosure of which is incorporated herein by reference in its entirety.

BACKGROUND

(a) Field

The present disclosure relates to a pixel and a display device using the same, and particularly, it relates to a pixel for improving crosstalk and a display device using the same.

(b) Description of the Related Art

Among various flat panel displays, an organic light emitting diode display uses an organic light emitting diode (OLED) as a light emitting element that generates light by recombination of electrons and holes for the display of images. The OLED display has a fast response speed, low power consumption, and excellent luminous efficiency, luminance, and viewing angle.

Recently, a plurality of pixels is integrated in a narrow region in a high-resolution display device requiring the transistors to be very small. A reduction in the size of the transistor signifies a reduction of a length of a channel region, and causes an issue of current leakage through a turned-off transistor as the length of the channel region is reduced.

Particularly, when the display device is operated at a high temperature, a threshold voltage of the transistor shifts, so a relatively large current leaks through the channel region of the turned-off transistor.

The above information disclosed in this Background section is only for enhancement of understanding of the background and therefore it may contain information that may not form a prior art that is already known to a person of ordinary skill in the art.

SUMMARY

The present disclosure has been made in an effort to remove a leakage current generated by operation at a high temperature.

The present disclosure has been made in an effort to prevent a crosstalk phenomenon of a display device.

An exemplary embodiment of the present disclosure provides a pixel including: an organic light emitting diode; a first transistor including a gate that is connected to a first node, wherein the first transistor is connected between a second node and a third node; a second transistor including a gate that is connected to a corresponding scan line, wherein the second transistor is connected between a data line and the second node; a storage capacitor connected between the first node and a first voltage; a third transistor including a gate that is connected to the corresponding scan line, wherein the third transistor is connected between the first node and the third node; and a fourth transistor connected between a first end of the first transistor and a second voltage.

The fourth transistor may be connected between the second node and the second voltage, and a leakage current applied from the second transistor may flow through the fourth transistor.

The fourth transistor may include a gate and a source that are connected to the second node and a drain that is connected to the second voltage.

The fourth transistor may include a source that is connected to the second node, a drain that is connected to the second voltage, and a gate that is connected to a DC voltage supply source having a voltage value of a gate-off level of the fourth transistor.

The fourth transistor may be connected between the third node and the second voltage, and a leakage current applied from the second transistor may flow through the fourth transistor in an off-state.

The fourth transistor may include a gate and a source that are connected to the third node and a drain that is connected to the second voltage.

The fourth transistor may include a source that is connected to the third node, a drain that is connected to the second voltage, and a gate that is connected to a DC voltage supply source having a voltage value with a gate-off level of the fourth transistor.

The pixel may further include: a fifth transistor including a gate that is connected to an emission control line, wherein the fifth transistor is connected between the first voltage and the second node; a sixth transistor including a gate that is connected to the emission control line, wherein the sixth transistor is connected between the third node and an anode of the organic light emitting diode; a seventh transistor including a gate that is connected to a previous scan line of the corresponding scan line, wherein the seventh transistor is connected between the first node and a second voltage; and an eighth transistor including a gate that is connected to the previous scan line, wherein the eighth transistor is connected between the anode of the organic light emitting diode and the second voltage.

A period in which the second transistor is turned off may correspond to a period until the organic light emitting diode emits light after the second transistor is turned off.

Another embodiment of the present disclosure provides a display device including: a scan driver for transmitting a plurality of scan signals to a plurality of scan lines; a data driver for transmitting a plurality of data signals to a plurality of data lines; a display unit including a plurality of pixels respectively connected to a corresponding scan line among the plurality of scan lines and a corresponding data line among the plurality of data lines, the pixels respectively emitting light according to a corresponding data signal and displaying an image; and a controller for controlling the scan driver and the data driver, generating the data signals, and supplying the data signals to the data driver, wherein a pixel of the plurality of pixels includes: an organic light emitting diode, a first transistor including a gate that is connected to a first node, wherein the first transistor is connected between a second node and a third node, a second transistor including a gate that is connected to a corresponding scan line, wherein the second transistor is connected between a data line and the second node, a storage capacitor connected between the first node and a first voltage, a third transistor including a gate that is connected to the corresponding scan line, wherein the third transistor is connected between the first node and the third node, and a fourth transistor connected between a first end of the first transistor and a second voltage.

The fourth transistor may be connected between the second node and the second voltage, and a leakage current applied from the second transistor may flow through the fourth transistor.

The fourth transistor may include a gate and a source that are connected to the second node, and a drain that is connected to the second voltage.

The fourth transistor may include a source that is connected to the second node, a drain that is connected to the second voltage, and a gate that is connected to a DC voltage supply source having a voltage value with a gate off level of the fourth transistor.

The fourth transistor is connected between the third node and the second voltage, and a leakage current applied from the second transistor flows through the fourth transistor in an off-state.

The fourth transistor may include a gate and a source that are connected to the third node, and a drain that is connected to the second voltage.

The fourth transistor may include a source that is connected to the third node, a drain that is connected to the second voltage, and a gate that is connected to a DC voltage supply source having a voltage value of a gate-off level of the fourth transistor.

The display device may further include an emission control driver for transmitting a plurality of emission control signals to a plurality of emission control lines, wherein the controller generates a control signal for controlling the emission control driver, and the pixel further includes: a fifth transistor including a gate that is connected to a corresponding emission control line among the plurality of emission control lines, wherein the fifth transistor is connected between the first voltage and the second node, a sixth transistor including a gate that is connected to the corresponding emission control line, wherein the sixth transistor is connected between the third node and an anode of the organic light emitting diode, a seventh transistor including a gate that is connected to a previous scan line of the corresponding scan line, wherein the seventh transistor is connected between the first node and a second voltage, and an eighth transistor including a gate that is connected to the previous scan line, wherein the eighth transistor is connected between an anode of the organic light emitting diode and the second voltage.

A period in which the second transistor is turned off may correspond to a period until the organic light emitting diode emits light after the second transistor is turned off.

Yet another embodiment of the present disclosure provides a pixel including: a storage capacitor for storing a data voltage corresponding to a data signal transmitted from a corresponding data line when a scan signal that is transmitted from a corresponding scan line has an enable level; a first transistor for generating a driving current corresponding to the data voltage; and a second transistor connected between a first end of the first transistor and an initialization voltage.

During a period in which the second transistor is turned off, a leakage current flows through the second transistor, wherein the leakage current is caused by another data signal applied to the corresponding data line when the scan signal has a disable level.

According to the exemplary embodiments, when the display device is operable at a high temperature, the leakage current caused by a black voltage may be removed.

According to the exemplary embodiments, a crosstalk phenomenon of the display device may be prevented.

According to the exemplary embodiments, a high-quality organic light emitting device may be provided.

DETAILED DESCRIPTION OF THE EMBODIMENTS

Figure 1:
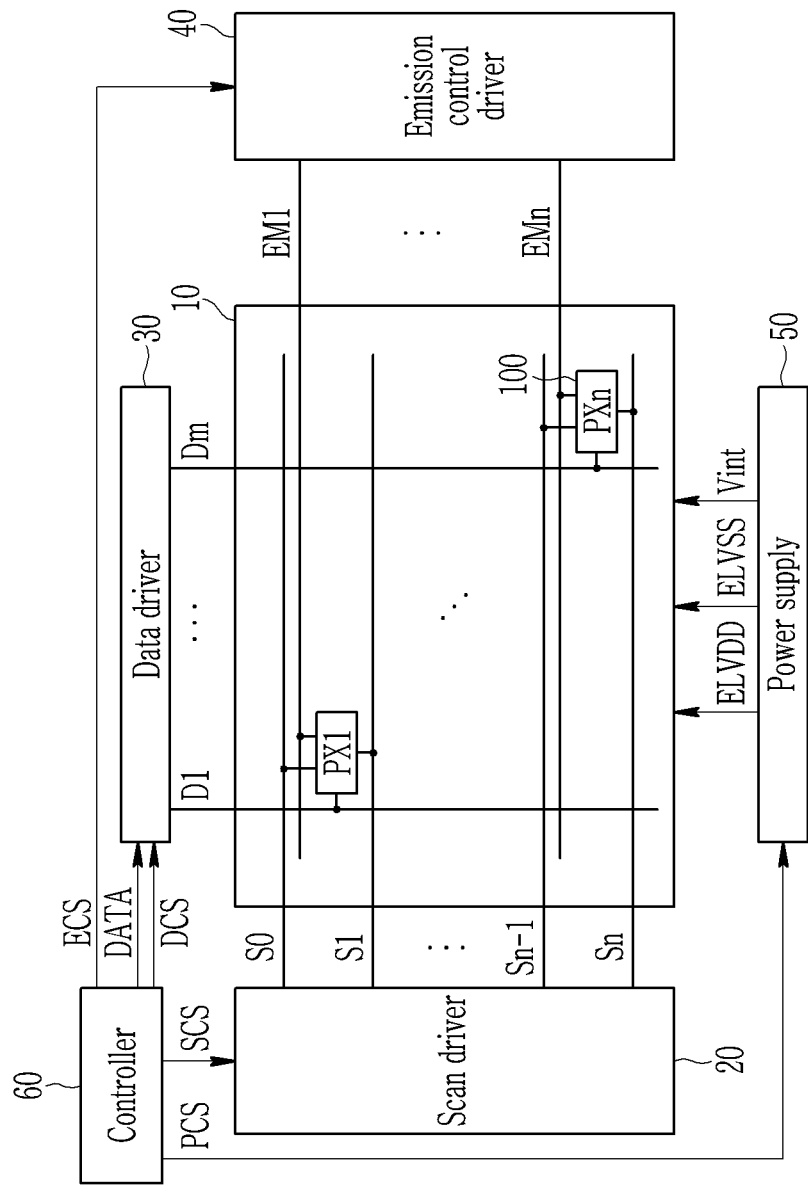
FIG. 1 shows a block diagram of a display device according to an exemplary embodiment.

The present disclosure will be described more fully hereinafter with reference to the accompanying drawings, in which exemplary embodiments are shown. As those skilled in the art would realize, the described embodiments may be modified in various different ways, all without departing from the spirit or scope of the present disclosure.

The drawings and description are to be regarded as illustrative in nature and not restrictive, and like reference numerals designate like elements throughout the specification.

Unless explicitly described to the contrary, the word "comprise" and variations such as "comprises" or "comprising" will be understood to imply the inclusion of stated elements but not the exclusion of any other elements.

FIG. 1 shows a block diagram of a display device according to an exemplary embodiment. As shown, the display device includes a display unit 10 including a plurality of pixels (PX1 to PXn), a scan driver 20, a data driver 30, an emission control driver 40, a power supply 50, and a controller 60.

Each of the pixels PX1 to PXn is connected to two corresponding scan lines among a plurality of scan lines (S1 to Sn), one corresponding emission control line among a plurality of emission control lines (EM1 to EMn), and one corresponding data line among a plurality of data lines (D1 to Dm). Further, although not directly shown in the display unit 10 of FIG. 1, the plurality of pixels (PX1 to PXn) is connected to a plurality of power supply lines to receive a first power supply voltage (ELVDD), a second power supply voltage (ELVSS), and an initialization voltage (Vint) from the power supply 50.

The plurality of pixels (PX1 to PXn) included in the display unit 10 is substantially arranged in a matrix form. Although not specifically limited, the plurality of scan lines (S1 to Sn) and the plurality of emission control lines (EM1 to EMn) extend substantially in a row direction of the pixels, and the plurality of data lines (D1 to Dm) extends substantially in a column direction of the pixels, and the respective scan lines, emission control lines, and the data lines are substantially provided in parallel to each other.

Each pixel of the plurality of pixels (PX1 to PXn) is connected to two corresponding scan lines. That is, the pixels (PX1 to PXn) are connected to a first scan line corresponding to a pixel row in which the corresponding pixel is included, and a second scan line corresponding to a previous pixel row. A group of pixels included in the first pixel row may be connected to a first scan line S1 and a dummy scan line S0. A group of pixels included in an n-th pixel row (n being greater than 1) is respectively connected to the n-th scan line (Sn) corresponding to the n-th pixel row that is a corresponding pixel row, and an (n−1)-th scan line Sn−1 corresponding the (n−1)-th pixel row that is a previous pixel row.

Each of the plurality of pixels (PX1 to PXn) emits light with predetermined luminance by a driving current supplied to an organic light emitting diode according to a corresponding data signal transmitted through the plurality of data lines (D1 to Dm).

The scan driver 20 generates a scan signal corresponding to each pixel through the plurality of scan lines (S1 to Sn), and transmits the same. That is, the scan driver 20 transmits a scan signal through scan lines corresponding to a respective plurality of pixels included in the respective pixel rows.

The scan driver 20 receives a scan driving control signal (SCS) from the controller 60 to generate scan signals, and sequentially supplies the scan signals to the plurality of scan lines (S1 to Sn) that is respectively connected to a group of pixels included in the respective pixel rows.

The data driver 30 transmits the data signal to the respective pixels through the plurality of data lines (D1 to Dm).

The data driver 30 receives a data driving control signal (DCS) from the controller 60, and supplies data signals corresponding to the plurality of data lines (D1 to Dm) that is respectively connected to a group of pixels included in the respective pixel columns.

The emission control driver 40 is connected to the plurality of emission control lines (EM1 to EMn) that is connected to the plurality of pixels (PX1 to PXn). That is, the plurality of emission control lines (EM1 to EMn) extends substantially in parallel to each other in the row direction and connects the plurality of pixels and the emission control driver 40.

The emission control driver 40 generates an emission control signal corresponding to each pixel through the plurality of emission control lines (EM1 to EMn). Each pixel is controlled to emit light corresponding to the image data signal in response to a control by the emission control signal. That is, the operation of the emission control transistor included in the pixel is controlled in response to the emission control signal transmitted through the corresponding emission control line, so the organic light emitting diode connected to the emission control transistor may or may not emit light with luminance based on the driving current corresponding to the data signal.

The power supply 50 supplies a first power supply voltage (ELVDD), a second power supply voltage (ELVSS), and an initialization voltage (Vint) to the respective pixels of the display unit 10. The first power supply voltage (ELVDD) may be a predetermined high-level voltage, and the second power supply voltage (ELVSS) may be less than the first power supply voltage (ELVDD) or may be a ground voltage. The initialization voltage (Vint) may be set to be a voltage value that is equal to or less than the second power supply voltage (ELVSS).

The voltage values of the first power supply voltage (ELVDD), the second power supply voltage (ELVSS), and the initialization voltage (Vint) are not limited to specific voltage values, but the voltage values may be set or controlled according to a control of a power control signal (PCS) that is transmitted by the controller 60.

The controller 60 converts a plurality of image signals into a plurality of image data signals (DATA) and transmits the same to the data driver 30. The controller 60 receives a vertical synchronization signal Vsync, a horizontal synchronizing signal Hsync, and a clock signal MCLK (not shown), generates control signals for controlling the scan driver 20, the emission control driver 40, and the data driver 30, and transmits them to the same. That is, the controller 60 generates the scan driving control signal (SCS) for controlling the scan driver 20, an emission driving control signal (ECS) for controlling the emission control driver 40, and the data driving control signal (DCS) for controlling the data driver 30, and transmits the same.

Further, the controller 60 generates the power control signal (PCS) for controlling the power supply 50 and transmits the same to the power supply 50.

FIG. 2 and FIG. 6 to FIG. 8 show circuit diagrams of a pixel according to an exemplary embodiment of the present disclosure. Particularly, FIG. 2 and FIG. 6 to FIG. 8 show circuit diagrams according to different exemplary embodiments on a pixel (PXn) 100 that is provided in a region defined by an n-th pixel row and an m-th pixel column among the plurality of pixels (PX1 to PXn) of the display unit 10 shown in FIG. 2. In these exemplary embodiments, the respective transistors will be exemplified as p-channel metal-oxide-semiconductor field-effect transistor (MOSFET) (PMOS transistors) for convenience of description.

Figure 2:
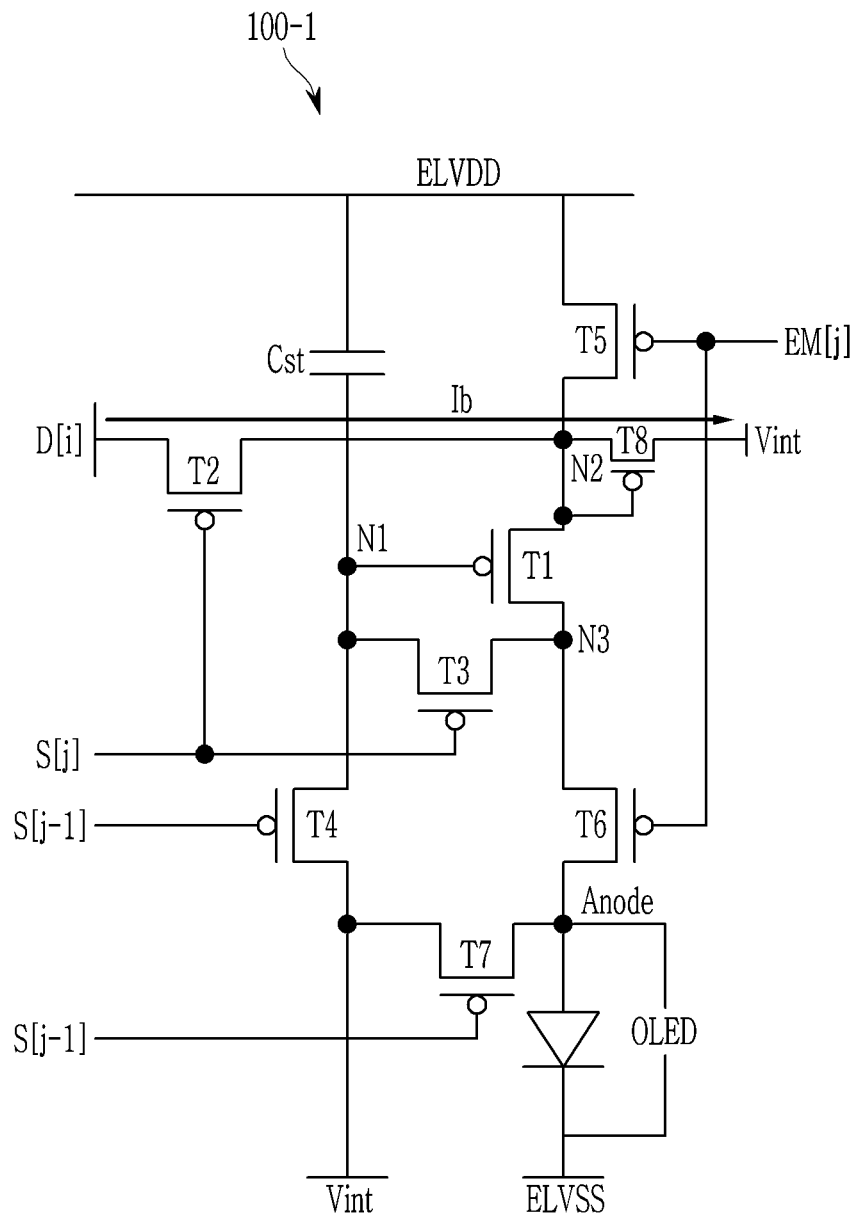
FIG. 2 shows a circuit diagram of a pixel of a display device shown in FIG. 1 according to a first exemplary embodiment.
Figure 3:
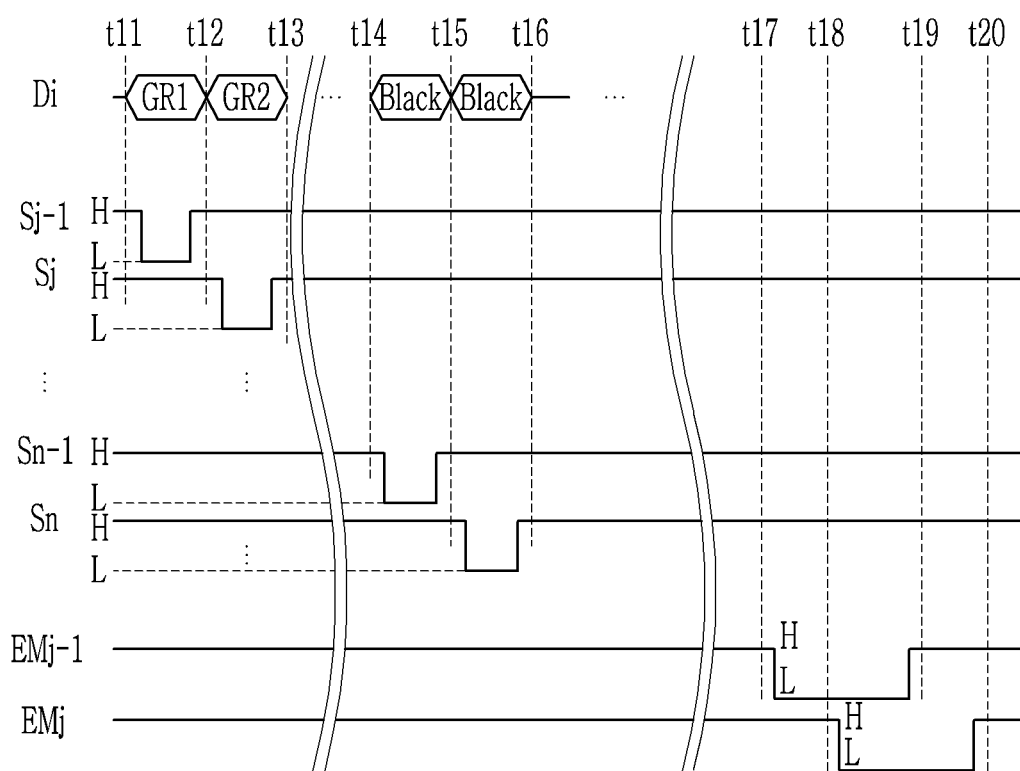
FIG. 3 shows a timing diagram of signals for driving a pixel shown in FIG. 1.

FIG. 3 shows a timing diagram of signals for driving a pixel of FIG. 2 and FIG. 6 to FIG. 8, and a process of driving the pixel according to the exemplary embodiments of FIG. 2 and FIG. 6 to FIG. 8 will be described.

A pixel 100-1 shown in FIG. 2 includes an organic light emitting diode (OLED), a storage capacitor (Cst), and first to eighth transistors (T1 to T8).

The first transistor T1 includes a gate connected to a first node N1, a source connected to a second node N2 that is also connected to a drain of the fifth transistor T5, and a drain connected to a third node N3. A driving current flows through the first transistor T1 according to a corresponding data signal (D[i]). A gate, a source, and a drain of a transistor may herein also be referred to as a gate electrode, a source electrode, and a drain electrode.

The driving current represents a current corresponding to a voltage difference between the source and the gate of the first transistor T1, and the driving current may be a variable current corresponding to the data voltage of the data signal (D[i]).

The second transistor T2 includes a gate connected to the j-th scan line (Sj), a source connected to the i-th data line (Di), and a drain connected to the second node N2 to which the source of the first transistor T1 and the drain of the fifth transistor T5 are connected in common. The second transistor T2 transmits the data voltage corresponding to the data signal (D[i]) through the i-th data line (Di) to the second node N2 in response to the corresponding scan signal (S[j]) that is transmitted through the j-th scan line (Sj).

The third transistor T3 includes a gate connected to the j-th scan line (Sj), and a drain and a source respectively connected to the gate and the drain of the first transistor T1. The third transistor T3 is operated in response to a corresponding scan signal (S[j]) that is transmitted through the j-th scan line (Sj). When turned on, the third transistor T3 connects the gate and the drain of the first transistor T1 to diode-connect the first transistor T1.

When the first transistor T1 is diode-connected, a voltage that is compensated by a threshold voltage of the first transistor T1 from the data voltage applied to the source of the first transistor T1 is applied to the gate of the first transistor T1. The gate of the first transistor T1 is connected to a first electrode of the storage capacitor (Cst), so the voltage is maintained by the storage capacitor (Cst). The data voltage that is compensated by the threshold voltage of the first transistor T1 is applied to the gate and maintained by the storage capacitor (Cst), so the driving current flowing through the first transistor T1 may not be influenced by the threshold voltage of the first transistor T1.

The fourth transistor T4 includes a gate connected to the (j−1)-th scan line Sj−1, a source connected to an initialization voltage supply line, and a drain connected to the first node Ni. The fourth transistor T4 transmits the initialization voltage (Vint) that is applied through the initialization voltage supply line to the first node N1 in response to a (j−1)-th scan signal (S[j−1]) that is transmitted through the (j−1)-th scan line (Sj−1). The fourth transistor T4 may transmit the initialization voltage (Vint) to the first node N1 before the data signal (D[i]) is applied, in response to the (j−1)-th scan signal (S[j−1]) that is transmitted through the (j−1)-th scan line (Sj−1) corresponding to the previous (j−1)-th pixel row. The (j−1)-th scan signal (S[j−1]) that is transmitted through the (j−1)-th scan line (Sj−1) is transmitted to the (j−1)-th pixel row in advance to the scan signal (S[j]) that is transmitted through the j-th scan line (Sj) is transmitted to the j-th pixel row that includes the corresponding pixel (100-1).

In this instance, the voltage value of the initialization voltage (Vint) is not limited, but it may be set to a low-level voltage value that can reduce the gate voltage of the first transistor T1 to initialize. That is, the gate of the first transistor T1 is initialized to have an initialization voltage (Vint) during a period in which the (j−1)-th scan signal (S[j−1]) is transmitted to the gate of the fourth transistor T4 with a gate-on voltage level.

The fifth transistor T5 includes a gate connected to the j-th emission control line (EMj), a source connected to a first power supply voltage (ELVDD) supply line, and a drain connected to the second node N2.

The sixth transistor T6 includes a gate connected to the j-th emission control line (EMj), a source connected to the third node N3, and a drain connected to the anode of the organic light emitting diode (OLED).

The fifth transistor T5 and the sixth transistor T6 are operated in response to a j-th emission control signal (EM[j]) that is transmitted through the j-th emission control line (EMj). When the fifth transistor T5 and the sixth transistor T6 are turned on in response to the j-th emission control signal (EM[j]), a current path is formed in a direction toward the organic light emitting diode (OLED) from the first power supply voltage (ELVDD). The driving current flowing through the organic light emitting diode (OLED) causes the organic light emitting diode (OLED) to emit light according to the driving current, thereby displaying an image corresponding to the data signal via the pixel (100-1).

The first electrode of the storage capacitor (Cst) is connected to the first node N1, and a second electrode of the storage capacitor (Cst) is connected to a first power supply voltage (ELVDD) supply line. The storage capacitor (Cst) is connected, as described above, between the gate of the first transistor T1 and the first power supply voltage (ELVDD) supply line, thereby maintaining the voltage applied to the gate of the first transistor T1.

The seventh transistor T7 includes a gate connected to the (j−1)-th scan line (Sj−1), a source connected to the anode of the organic light emitting diode (OLED), and a drain connected to the initialization voltage (Vint).

The seventh transistor T7 may transmit the initialization voltage (Vint) to the anode of the organic light emitting diode (OLED) in response to the (j−1)-th scan signal (S[j−1]) that is transmitted through the (j−1)-th scan line (Sj−1) corresponding to the previous (j−1)-th pixel row. The anode of the organic light emitting diode (OLED) is reset to be a sufficiently low voltage according to the transmitted initialization voltage (Vint).

The eighth transistor T8 includes a source and a gate connected to the second node N2, and a drain connected to the initialization voltage (Vint). The gate and the source of the eighth transistor T8 are connected in common to the second node N2, so the eighth transistor T8 is diode-connected at the second node N2.

The detailed driving operation according to the timing diagram of FIG. 3 is described with respect to the block diagram of the display device shown in FIG. 1 and the circuit diagram of the pixel (100-1) shown in FIG. 2.

FIG. 3 shows a timing diagram of a signal for driving a pixel 100 shown in FIG. 1. It will be described with reference to FIG. 3 that some pixels, for example, the pixel that is connected to the (n−1)-th scan line (n−1) and the i-th data line (Di) and the pixel that is connected to the n-th scan line (n) and the same i-th data line (Di), display a black image.

Other pixels connected to the same i-th data line (Di) may be influenced by the data signal (Black) corresponding to a black gray applied to a pixel that displays the black image. Until an emission control signal with a low-level voltage (L) is applied after the data signal is transmitted to some pixels, a leakage current Ib may be generated by the data signal (Black) that is applied to the i-th data line (Di). In this case, the voltage stored in the first node N1 may be reduced by the leakage current Ib. By the reduced voltage, each pixel may display an image that is darker than the image according to the corresponding data signal, thereby generating a crosstalk phenomenon.

Resultantly, the crosstalk phenomenon is generated by the pixels connected to the same data line (Di) as the pixel that displays a black image.

Referring to FIGS. 2 and 3, during a period between t11 and t12, the fourth transistor T4 and the seventh transistor T7 are turned on by the low-level voltage (L) of the (j−1)-th scan signal (S[j−1]) that is transmitted through the (j−1)-th scan line (Sj−1). The initialization voltage (Vint) for initializing the voltage at the gate electrode of the driving transistor T1 is transmitted to the first node N1 through the fourth transistor T4.

During a period between t12 and t13, the second transistor T2 and the third transistor T3 are turned on by the low-level voltage (L) of the j-th scan signal (S[j]) that is transmitted through the j-th scan line (Sj). The corresponding data signal GR2 on the data line (Di) is transmitted to the first node N1 through the turned-on second transistor T2, and the first transistor T1 is diode-connected through the turned-on third transistor T3.

During a period between t14 and t15, the data signal (Black) corresponding to the black gray is applied to the i-th data line (Di). The period between t14 and t15 will now be described with reference to FIG. 4.

Figure 4:
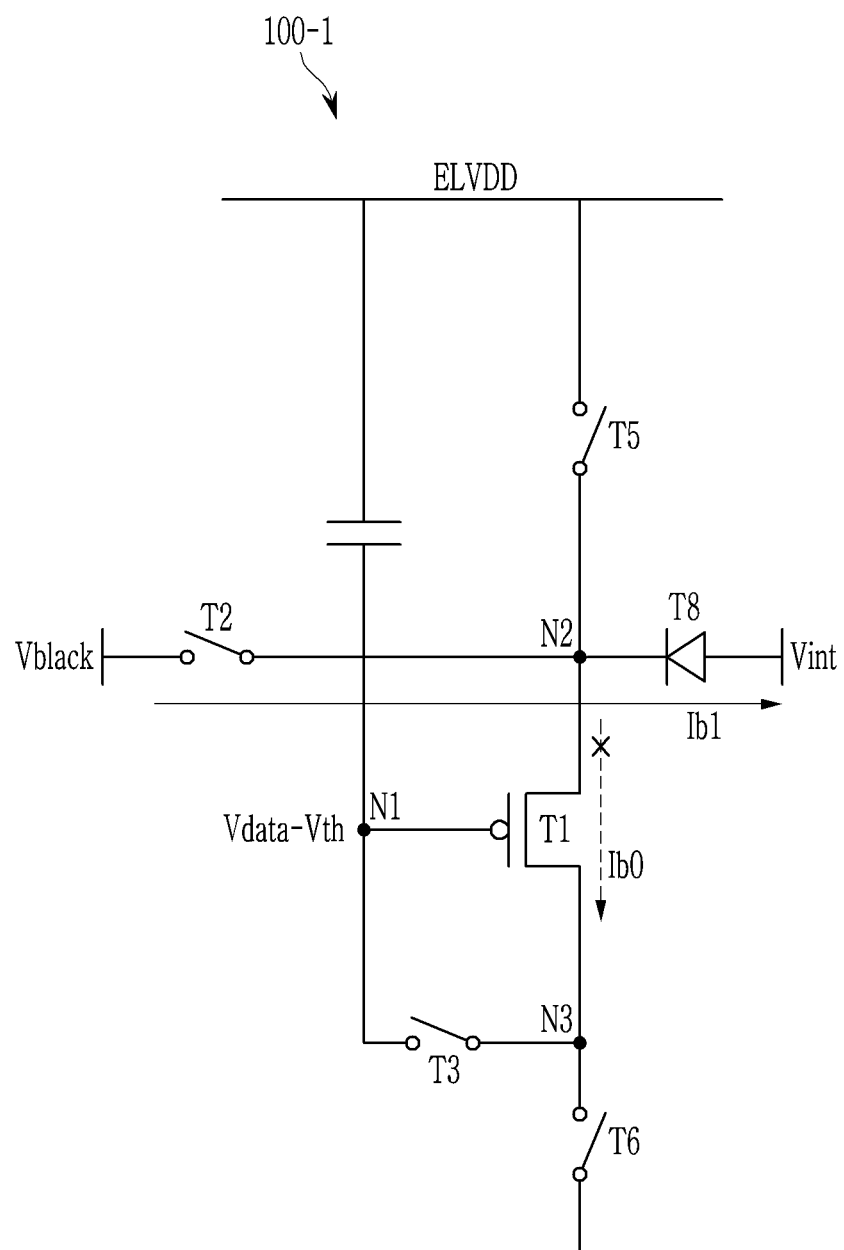
FIG. 4 shows a part of a pixel driven by signals shown in FIG. 3.

FIG. 4 shows a part of a pixel connected to a j-th scan line (Sj) and an i-th data line (Di) driven by signals shown in FIG. 3. As shown in FIG. 4, the second transistor T2, the third transistor T3, the fifth transistor T5, and the sixth transistor T6 are turned off.

However, when the transistors (T1 to T8) included in the pixel (100-1) are operated at a high temperature, a leakage current may flow through the transistors when a voltage difference between the gate and the source is small or zero according to a positive shift of the threshold voltage of the transistors.

When a black voltage (Vblack) that corresponds to the data signal (Black) of the black gray is applied to the i-th data line (Di), a leakage current Ib1 may flow through the turned-off second transistor T2 by the voltage difference between the black voltage (Vblack) and the second node N2.

The eighth transistor T8 is inversely diode-connected to the second node N2, and the initialization voltage supply line is connected to the drain of the eighth transistor T8. A leakage current (Ib) sinks to the initialization voltage (Vint) through the eighth transistor T8 by the positive shift of the threshold voltage and a voltage difference between the initialization voltage (Vint) and the second node N2. Accordingly, the applying of the black voltage (Vblack) to the i-th data line (Di) before the pixel 100-1 emits light does not influence the voltage maintained at the first node N1 in the pixel 100-1.

During a period between t18 to t20, the fifth transistor T5 and the sixth transistor T6 are turned on by the emission control signal (EMj) with a low-level voltage (L). The driving current caused by the voltage stored in the storage capacitor (Cst) is transmitted to the organic light emitting diode (OLED), and the organic light emitting diode (OLED) emits light.

In the conventional pixel configuration without the eighth transistor T8, the leakage current Ib1 is transmitted to the first node N1 through the first transistor T1 and the turned-off third transistor T3 to reduce the voltage. As a result, the pixel displays a gray that is less than a gray according to the data voltage applied to the data line (Di), thereby generating a crosstalk phenomenon.

Figure 5A:
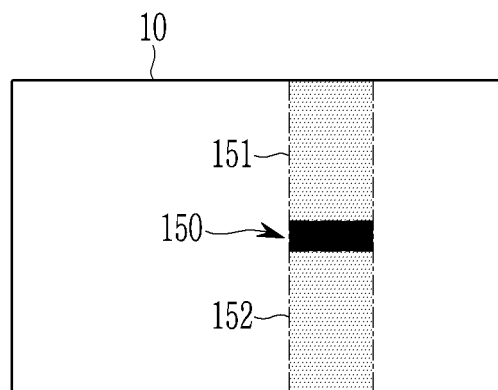
FIG. 5A shows a display unit of a comparative display device exhibiting a crosstalk phenomenon.
Figure 5B:
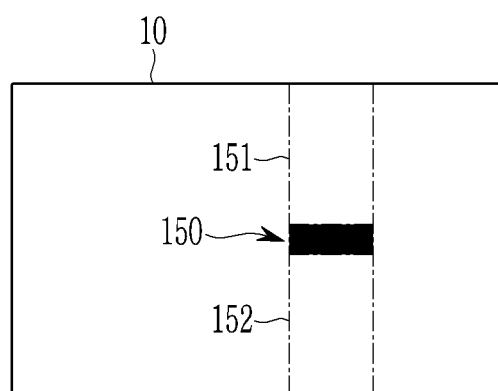
FIG. 5B shows a display unit of a display device according to an exemplary embodiment.

FIG. 5A shows a display unit of a comparative display device exhibiting a crosstalk phenomenon, and FIG. 5B shows a display unit of a display device according to an exemplary embodiment. Regarding FIGS. 5A and 5B, it will be assumed that a first region 150 of the display unit 10 displays a black image, and the adjacent regions 151 and 152 display a white image.

As shown in FIG. 5A, when the first region 150 in the display unit 10 displays the black image, the adjacent regions 151 and 152 that include pixels that are connected to the same data lines as the pixels in the first region 150 display an image that is darker than the white image, thereby exhibiting a crosstalk phenomenon.

However, in the case of the display device including a pixel 100-1 according to an exemplary embodiment, as shown in FIG. 5B, when the first region 150 displays the black image, the adjacent regions 151 and 152 that include pixels that are connected to the same data lines as the pixels in the first region 150 display the white image without exhibiting a crosstalk phenomenon.

That is, according to an exemplary embodiment, even when the display device is operated at a high temperature, the leakage current caused by the black voltage can be removed using the eighth transistor T8, thereby preventing the crosstalk phenomenon of the display device.

A pixel according to other exemplary embodiments will now be described with reference to FIG. 6 to FIG. 8.

Figure 6:
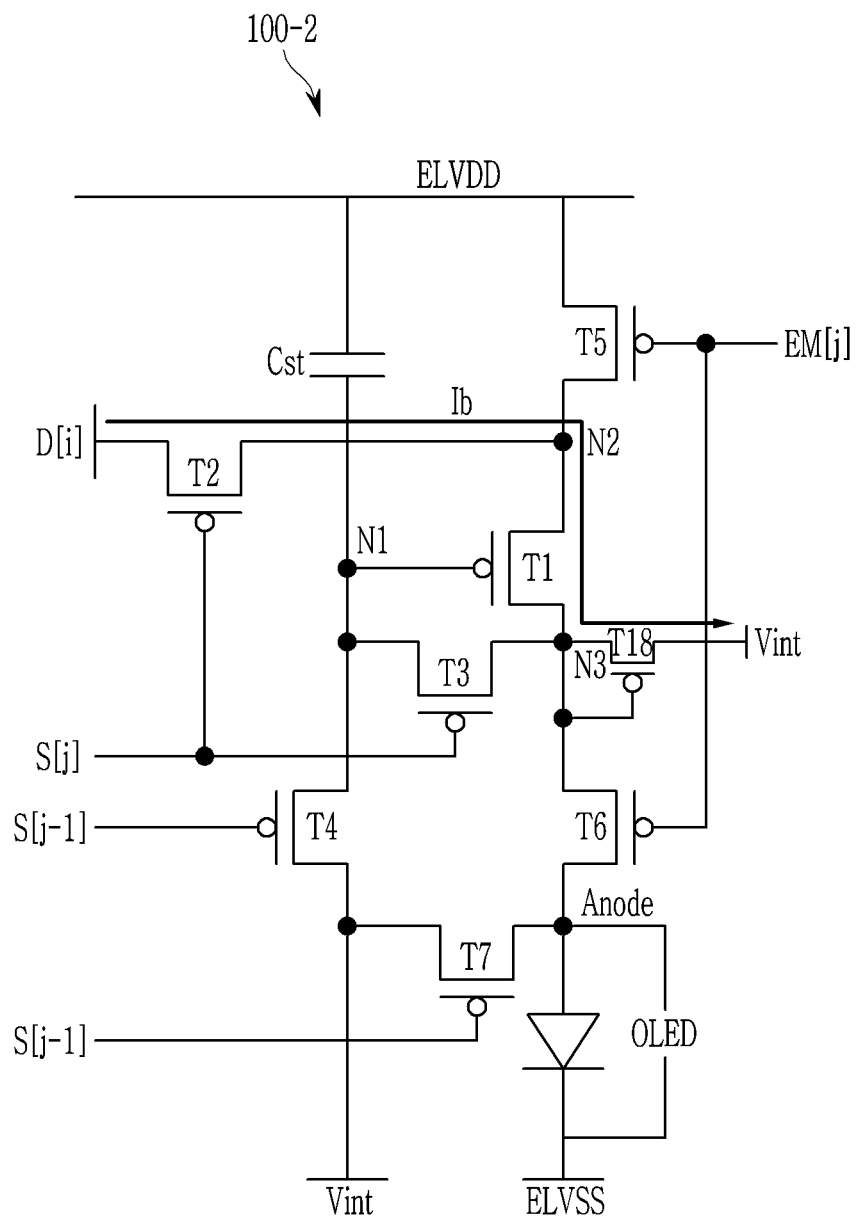
FIG. 6 shows a circuit diagram of a pixel of a display device shown in FIG. 1 according to a second exemplary embodiment.

FIG. 6 shows a pixel 100-2 that may be included in the display device of FIG. 1.

The pixel 100-2 shown in FIG. 6 is different from the pixel 100-1 of FIG. 2 except for the eighth transistor T18 that replaces the eighth transistor T8 of the pixel 100-1 shown in FIG. 2.

The eighth transistor T18 includes a source and a gate that are connected to the third node N3 and a drain connected to the initialization voltage (Vint). The gate and the source of the eighth transistor T18 are connected in common to the third node N3, so the eighth transistor T18 is diode-connected to the third node N3.

Regarding an operation process of the pixel 100-2 with reference to FIG. 3, during a period between t11 and t12, the fourth transistor T4 and the seventh transistor T7 are turned on by the low-level voltage (L) of the (j−1)-th scan signal (S[j−1]) that is transmitted through the (j−1)-th scan line Sj-1. The initialization voltage (Vint) for initializing the voltage of the gate electrode of the driving transistor T1 is transmitted to the first node N1 through the fourth transistor T4.

During a period of t12 between t13, the second transistor T2 and the third transistor T3 are turned on by the low-level voltage (L) of the j-th scan signal (S[j]) that is transmitted through the j-th scan line (Sj). A corresponding data signal GR2 on the data line (Di) is transmitted to the first node N1 through the turned-on second transistor T2, and the first transistor T1 is diode-connected through the turned-on third transistor T3.

During a period between t14 and t15, the data signal (Black) corresponding to the black gray is applied to the i-th data line (Di).

Due to the voltage difference between the black voltage (Vblack) and the second node N2, the leakage current Ib1 may flow to the second node N2 through the turned-off second transistor T2 and further to the third node N3 through the first transistor T1.

The eighth transistor T18 is inversely diode-connected to the third node N3, and the initialization voltage (Vint) is connected to the drain of the eighth transistor T18. By the positive shift of the threshold voltage and the voltage difference between the initialization voltage (Vint) and the third node N3, the leakage current (Ib) sinks to the initialization voltage (Vint) through the eighth transistor T18. Accordingly, the applying of the black voltage (Vblack) to the i-th data line (Di) before the pixel 100-2 emits light does not influence the voltage maintained at the first node N1 of the pixel 100-2.

During a period between t18 and t20, the fifth transistor T5 and the sixth transistor T6 are turned on by the emission control signal (EMj) with the low-level voltage (L). The driving current is transmitted to the organic light emitting diode (OLED) by the voltage charged in the storage capacitor (Cst), and the organic light emitting diode (OLED) emits light.

That is, according to an exemplary embodiment, when the display device is operated at a high temperature, the crosstalk phenomenon of the display device may be prevented by removing the leakage current that may be caused by the black voltage using the eighth transistor T18.

Figure 7:
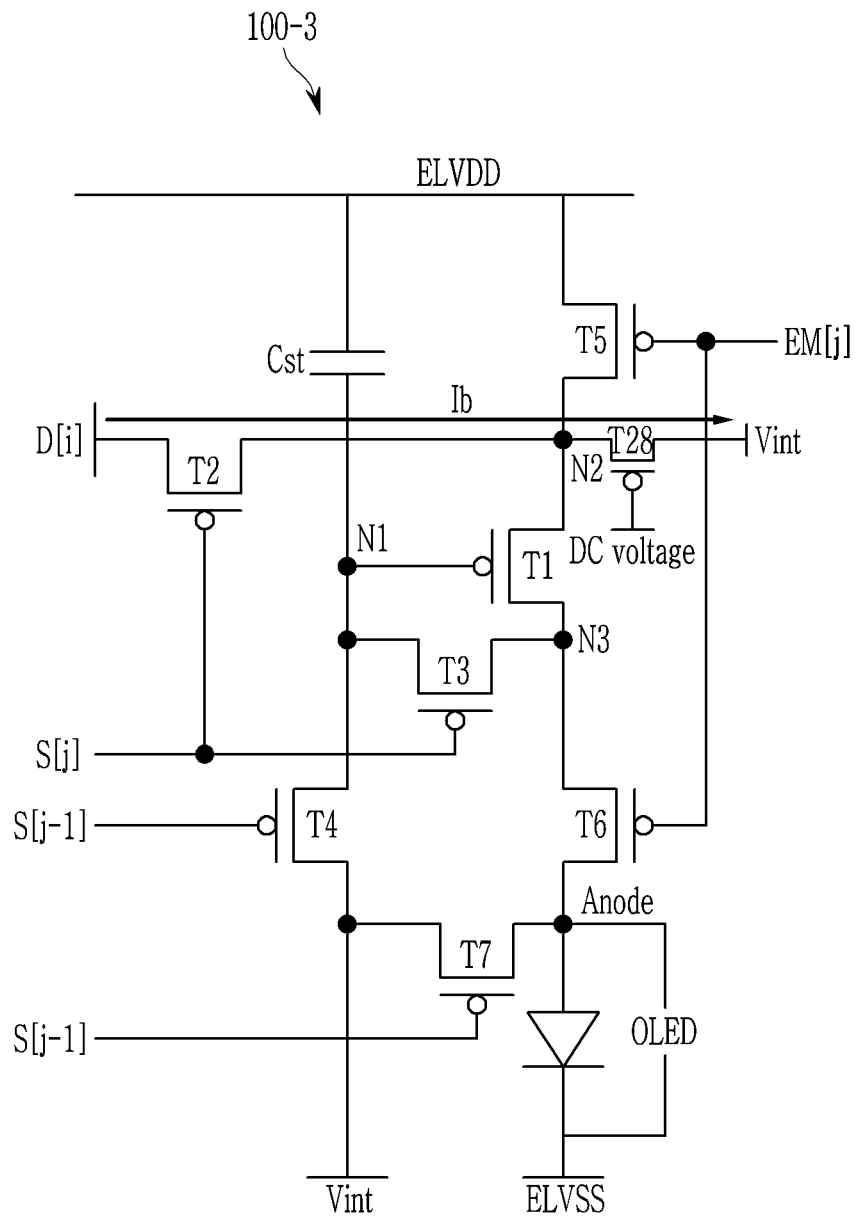
FIG. 7 shows a circuit diagram of a pixel of a display device shown in FIG. 1 according to a third exemplary embodiment.

FIG. 7 shows a pixel 100-3 according to an exemplary embodiment. The pixel 100-3 shown in FIG. 7 is different from the pixel 100-1 shown in FIG. 2 except that the gate of the eighth transistor T28 that replaces the eighth transistor T8 is connected to a DC voltage supply source.

That is, the eighth transistor T28 shown in FIG. 7 includes a source connected to the second node N2, a drain connected to the initialization voltage (Vint), and a gate connected to the DC voltage supply source. Therefore, the eighth transistor T28 receives a predetermined DC voltage from the DC voltage supply source irrespective of the operation of elements of the pixel 100-3 according to the driving timing diagram of FIG. 3. In this instance, the DC voltage is a predetermined voltage for turning off the eighth transistor T28, and in an exemplary embodiment of FIG. 7, the pixel 100-3 is configured as a PMOS transistor, so the DC voltage may be a predetermined high-level voltage.

Therefore, the DC voltage having a transistor-off level is transmitted to the gate, so the eighth transistor T28 is turned off, and the leakage current (Ib) caused by the black voltage (Vblack) applied to the i-th data line (Di) sinks to the initialization voltage (Vint).

Figure 8:
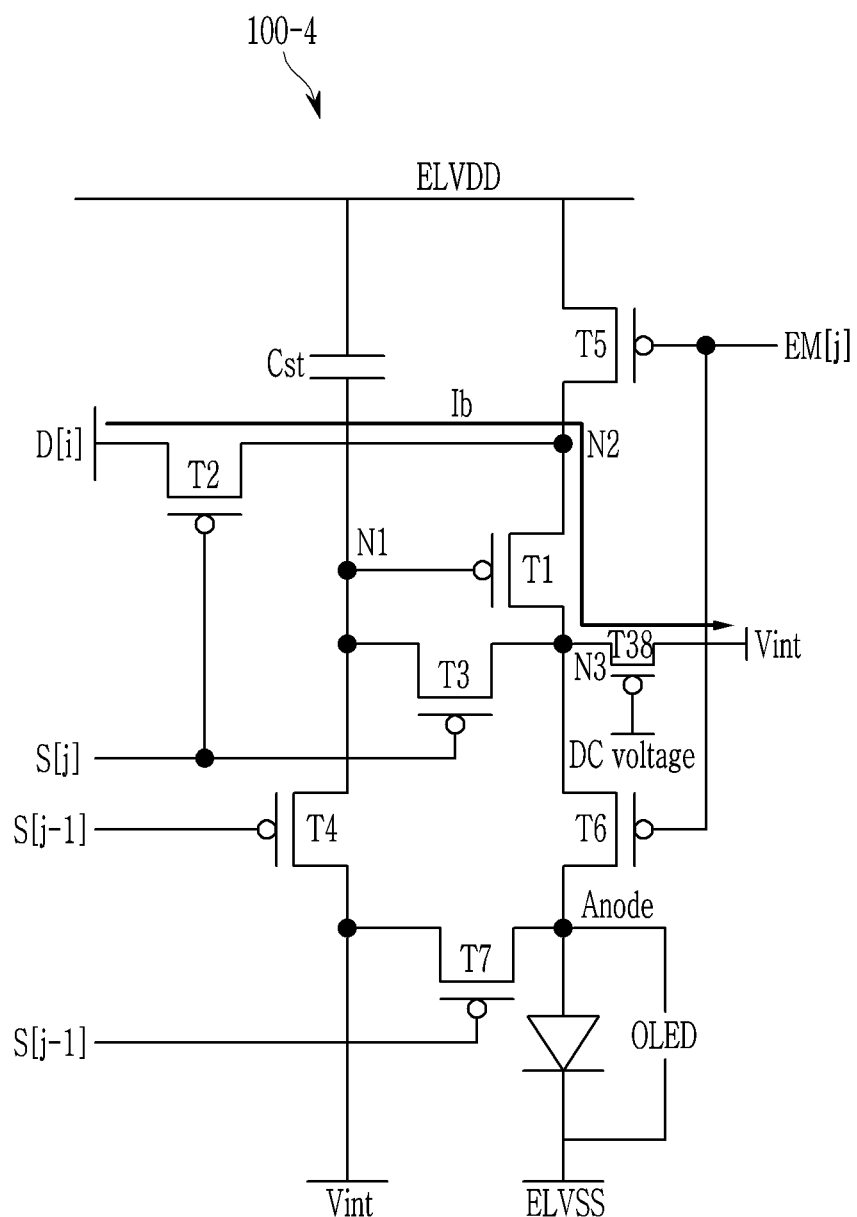
FIG. 8 shows a circuit diagram of a pixel of a display device shown in FIG. 1 according to a fourth exemplary embodiment.

FIG. 8 shows a pixel 100-4 according to an exemplary embodiment. The pixel 100-4 shown in FIG. 8 is different from the pixel 100-2 shown in FIG. 6 except that the eighth transistor T38 that replaces the eighth transistor T18 is connected to a DC voltage supply source.

That is, the eighth transistor T38 shown in FIG. 8 includes a source connected to the third node N3, a drain connected to the initialization voltage (Vint), and a gate connected to the DC voltage supply source. Therefore, the eighth transistor T38 receives a predetermined DC voltage from the DC voltage supply source irrespective of the operation of elements of the pixel 100-4 according to the driving timing diagram of FIG. 3.

By applying the DC voltage of the transistor-off level to the gate, the eighth transistor T38 is turned off, so the leakage current (Ib) caused by the black voltage (Vblack) applied to the i-th data line (Di) sinks to the initialization voltage (Vint).

In the display device including pixels (100-1, 100-2, 100-3, and 100-4) according to an exemplary embodiment of FIG. 2 and FIG. 6 to FIG. 8, when the display device is operated at a high temperature, the leakage current that may be caused the black voltage is removed to suppress the crosstalk phenomenon, thereby improving an image quality characteristic.

Regarding the pixels (100-1, 100-2, 100-3, and 100-4), it is described that the eighth transistor (e.g., T8, T18, T28, and T38) is connected to the second node N2 or the third node N3 respectively, however the eighth transistor T8 may be connected to the second node N2 of one pixel, and the eighth transistor T18 may be connected to the third node N3 of the pixel.

While the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims.

What is claimed is:

1. A pixel comprising:
an organic light emitting diode;
a first transistor including a gate that is connected to a first node, a source that is connected to a second node, and a drain that is connected to a third node;
a second transistor including a gate that is connected to a corresponding scan line, wherein the second transistor is connected between a data line and the second node;
a storage capacitor connected between the first node and a first voltage;
a third transistor including a gate that is connected to the corresponding scan line, wherein the third transistor is connected between the first node and the third node; and
a fourth transistor including a gate, a source that is directly connected to either the source of the first transistor or the drain of the first transistor, and a drain that is connected to a second voltage.

2. The pixel of claim 1, wherein
the fourth transistor is connected between the second node and the second voltage, and a leakage current applied from the second transistor flows through the fourth transistor.

3. The pixel of claim 2, wherein
the gate of the fourth transistor and the source of the fourth transistor are diode-connected to the second node.

4. The pixel of claim 2, wherein
the source of the fourth transistor is connected to the second node, and the gate of the fourth transistor is connected to a DC voltage supply source having a voltage value of a gate-off level of the fourth transistor.

5. The pixel of claim 1, wherein
the fourth transistor is connected between the third node and the second voltage, and a leakage current applied from the second transistor flows through the fourth transistor in an off-state.

6. The pixel of claim 5, wherein
the gate of the fourth transistor and the source of the fourth transistor are diode-connected to the third node.

7. The pixel of claim 5, wherein
the source of the fourth transistor is connected to the third node, and the gate of the fourth transistor is connected to a DC voltage supply source having a voltage value with a gate-off level of the fourth transistor.

8. The pixel of claim 1, further comprising:
a fifth transistor including a gate that is connected to an emission control line, wherein the fifth transistor is connected between the first voltage and the second node;
a sixth transistor including a gate that is connected to the emission control line, wherein the sixth transistor is connected between the third node and an anode of the organic light emitting diode;
a seventh transistor including a gate that is connected to a previous scan line of the corresponding scan line, wherein the seventh transistor is connected between the first node and the second voltage; and
an eighth transistor including a gate that is connected to the previous scan line, wherein the eighth transistor is connected between the anode of the organic light emitting diode and the second voltage.

9. The pixel of claim 1, wherein
a period in which the second transistor is turned off corresponds to a period until the organic light emitting diode emits light after the second transistor is turned off.

10. A display device comprising:
a scan driver for transmitting a plurality of scan signals to a plurality of scan lines;
a data driver for transmitting a plurality of data signals to a plurality of data lines;
a display unit including a plurality of pixels respectively connected to a corresponding scan line among the plurality of scan lines and a corresponding data line among the plurality of data lines, the pixels respectively emitting light according to a corresponding data signal and displaying an image; and a controller for controlling the scan driver and the data driver, generating the data signals, and supplying the data signals to the data driver, wherein a pixel of the plurality of pixels comprises:

an organic light emitting diode, a first transistor including a gate that is connected to a first node, a source that is connected to a second node, and a drain that is connected to a third node, a second transistor including a gate that is connected to a corresponding scan line, wherein the second transistor is connected between a data line and the second node, a storage capacitor connected between the first node and a first voltage, a third transistor including a gate that is connected to the corresponding scan line, the third transistor is connected between the first node and the third node, and a fourth transistor including a gate, a source that is directly connected to either the source of the first transistor or the drain of the first transistor, and a drain that is connected to a second voltage.

11. The display device of claim 10, wherein
the fourth transistor is connected between the second node and the second voltage, and a leakage current applied from the second transistor flows through the fourth transistor.

12. The display device of claim 11, wherein
the gate of the fourth transistor and the source of the fourth transistor are diode-connected to the second node.

13. The display device of claim 11, wherein
the source of the fourth transistor is connected to the second node, and the gate of the fourth transistor is connected to a DC voltage supply source having a voltage value with a gate off level of the fourth transistor.

14. The display device of claim 10, wherein
the fourth transistor is connected between the third node and the second voltage, and a leakage current applied from the second transistor flows through the fourth transistor in an off-state.

15. The display device of claim 14, wherein
the gate of the fourth transistor and the source of the fourth transistor are diode-connected to the third node.

16. The display device of claim 14, wherein
the source of the fourth transistor is connected to the third node, and the gate of the fourth transistor is connected to a DC voltage supply source having a voltage value of a gate-off level of the fourth transistor.

17. The display device of claim 10, further comprising
an emission control driver for transmitting a plurality of emission control signals to a plurality of emission control lines, wherein the controller generates a control signal for controlling the emission control driver, and the pixel further comprises:

a fifth transistor including a gate that is connected to a corresponding emission control line among the plurality of emission control lines, wherein the fifth transistor is connected between the first voltage and the second node, a sixth transistor including a gate that is connected to the corresponding emission control line, wherein the sixth transistor is connected between the third node and an anode of the organic light emitting diode, a seventh transistor including a gate that is connected to a previous scan line of the corresponding scan line, wherein the seventh transistor is connected between the first node and the second voltage, and an eighth transistor including a gate that is connected to the previous scan line, wherein the eighth transistor is connected between an anode of the organic light emitting diode and the second voltage.

18. The display device of claim 10, wherein
a period in which the second transistor is turned off corresponds to a period until the organic light emitting diode emits light after the second transistor is turned off.

19. A pixel comprising:
a storage capacitor for storing a data voltage corresponding to a data signal that is transmitted from a corresponding data line when a scan signal that is transmitted from a corresponding scan line has an enable level;

a first transistor for generating a driving current corresponding to the data voltage; and a second transistor connected between a first end of the first transistor and an initialization voltage, wherein during a period in which the second transistor is turned off, a leakage current flows through the second transistor, wherein the leakage current is caused by another data signal applied to the corresponding data line when the scan signal has a disable level.

* * * * *